(12) United States Patent
Hutchins

(10) Patent No.: US 10,920,643 B2
(45) Date of Patent: Feb. 16, 2021

(54) FLUID FLOW NETWORK FOR A VEHICLE INCLUDING FLOW MEMBERS THAT RESPOND TO A FLOW IMBALANCE

(71) Applicant: JAGUAR LAND ROVER LIMITED, Warwickshire (GB)

(72) Inventor: William Hutchins, Coventry (GB)

(73) Assignee: JAGUAR LAND ROVER LIMITED, Whitley (GB)

(*) Notice: Subject to any disclaimer, the term of this patent is extended or adjusted under 35 U.S.C. 154(b) by 0 days.

(21) Appl. No.: 16/255,966

(22) Filed: Jan. 24, 2019

(65) Prior Publication Data

US 2019/0234277 A1 Aug. 1, 2019

(30) Foreign Application Priority Data

Jan. 30, 2018 (GB) ..................................... 1801464

(51) Int. Cl.
| | |
|---|---|
| F01N 5/02 | (2006.01) |
| F01N 13/08 | (2010.01) |
| F01N 1/16 | (2006.01) |
| F01N 13/00 | (2010.01) |
| H01L 35/04 | (2006.01) |

(52) U.S. Cl.
CPC ............. *F01N 5/025* (2013.01); *F01N 1/166* (2013.01); *F01N 13/001* (2013.01); *F01N 13/08* (2013.01); *F01N 2240/20* (2013.01); *F01N 2240/36* (2013.01); *F01N 2410/00* (2013.01); *H01L 35/04* (2013.01); *Y02T 10/12* (2013.01)

(58) Field of Classification Search
CPC .......... F01N 1/163; F01N 1/166; F01N 5/025; F01N 13/08; F01N 2240/20; F01N 2240/36

See application file for complete search history.

(56) References Cited

U.S. PATENT DOCUMENTS

| | | | | |
|---|---|---|---|---|
| 1,709,426 | A * | 4/1929 | Beery | F01N 1/084 |
| | | | | 181/254 |
| 4,923,484 | A * | 5/1990 | Saito | F01N 3/0222 |
| | | | | 55/283 |
| 2011/0120106 | A1* | 5/2011 | Bruck | H01L 35/30 |
| | | | | 60/320 |

(Continued)

FOREIGN PATENT DOCUMENTS

| | | | |
|---|---|---|---|
| GB | 2549121 A | 10/2017 | |
| JP | 2008274790 A * | 11/2008 | ............. F01N 5/025 |

(Continued)

OTHER PUBLICATIONS

Combined Search and Examination Report under Sections 17 and 18(3) for Application No. GB1801464.7 dated Jul. 25, 2018.

*Primary Examiner* — Laert Dounis
(74) *Attorney, Agent, or Firm* — Carlson, Gaskey & Olds

(57) ABSTRACT

A fluid flow network for a vehicle includes first and second flow ducts having a common inlet and a common outlet; a flow directing member movable about a first axis and configured to direct flow from the common inlet to at least one of the first and second flow ducts; a flow reactive member configured to detect an imbalance between the flow exiting the first flow duct and the flow exiting the second flow duct; and means for adjusting the position of the flow directing member if an imbalance is detected by the flow reactive member.

20 Claims, 9 Drawing Sheets

(56) References Cited

U.S. PATENT DOCUMENTS

| | | | | |
|---|---|---|---|---|
| 2013/0152989 A1* | 6/2013 | Krinn | ...................... | H01L 35/30 |
| | | | | 136/210 |
| 2014/0182648 A1* | 7/2014 | Seon | ...................... | H01L 35/30 |
| | | | | 136/211 |
| 2017/0335738 A1* | 11/2017 | Garnemark | ............. | F01N 3/032 |
| 2019/0088846 A1* | 3/2019 | Hutchins | ................. | F01N 13/08 |
| 2019/0153977 A1* | 5/2019 | Hutchins | ................... | F02G 5/04 |

FOREIGN PATENT DOCUMENTS

| | | | | |
|---|---|---|---|---|
| WO | 2005083242 A1 | 9/2005 | | |
| WO | WO-2011107282 A1 * | 9/2011 | ............. | F01N 5/025 |

\* cited by examiner

2

FLUID FLOW NETWORK FOR A VEHICLE INCLUDING FLOW MEMBERS THAT RESPOND TO A FLOW IMBALANCE

CROSS REFERENCE TO RELATED APPLICATION

This application claims priority to United Kingdom Patent Application No. GB 1801464.7 filed on 30 Jan. 2018.

TECHNICAL FIELD

The present disclosure relates to a fluid flow network for a vehicle and particularly, but not exclusively, to a flow network for an energy recovery unit. Aspects of the invention relate to an exhaust system and to a vehicle incorporating the fluid flow network.

BACKGROUND

Thermoelectric generators (TEGs) convert heat energy to electrical energy using the Seebeck effect. A typical TEG comprises a pair of metal plates having high thermal conductivities with thermoelectric materials sandwiched between them.

It is well-known that vehicle engines are only about 30% efficient, and in normal use generate significant waste heat. Over recent years, TEG devices have been incorporated into vehicle exhaust systems in order to harness waste heat from the exhaust gas. This decreases the load of an electric generator such as an alternator on the engine, in turn improving fuel consumption.

A problem associated with using TEGs in this way is that they only operate efficiently over a relatively narrow temperature range—at low temperatures, energy generation is very inefficient; and at high temperatures, the thermoelectric materials are in danger of damage from overheating. In certain scenarios, it has been found that the leading edges of the TEGs may overheat before the majority of the TEG has reached a suitably high temperature for efficient operation to occur. As a result, the hot exhaust air must be diverted away from the thermoelectric materials using bypass valves to prevent damage to the TEG, thereby decreasing the system performance.

SUMMARY

According to an aspect of the present invention there is provided a fluid flow network for a vehicle, the fluid flow network comprising: first and second flow ducts having a common inlet and a common outlet; a flow directing member configured to direct flow from the common inlet to at least one of the first and second flow ducts; a flow reactive member configured to move in response to an imbalance between the flow exiting the first flow duct and the flow exiting the second flow duct; a linkage configured to transmit movement of the flow directing member if an imbalance causes movement of the flow reactive member.

The flow directing member is configured to direct flow received at the common inlet, in desired proportion, to at least one of the first and second flow ducts (e.g. equal flows through both the first and second ducts), the flow reactive member is configured to sense any deviation from said desired proportion (i.e. to detect an imbalance), and the linkage is configured to adjust the position of the flow directing member if the deviation from said desired proportion is caused by the flow reactive member, thereby to achieve the desired proportion.

Advantageously, the fluid flow network therefore addresses and corrects deviations of the actual flow pattern from the intended flow pattern. As such, damage to the network that may cause an imbalance, or differences in manufacturing that result in slightly different proportions of flow through each duct, are less problematic as the fluid flow network automatically adjusts itself to correct the imbalance.

The flow directing member may be movable about a first axis and the flow reactive member may be movable about a second axis.

The flow reactive member is optionally configured to direct flow exiting the first and second flow ducts.

The flow directing member may be disposed in a first transition duct joining the common inlet and the first and second flow ducts. The flow reactive member may be disposed in a second transition duct joining the first and second flow ducts and the common outlet.

At least one of the flow directing member and the flow reactive member may be defined by a planar element.

The planar element of the flow directing member may include an upstream and a downstream edge. The first axis may be located between the pair of upstream and downstream edges.

The planar element of the flow reactive member may comprise a flap which may include an upstream and a downstream edge. The second axis may be located substantially along the upstream edge.

The first transition duct may comprise a concave recess between the first and second flow ducts.

The second axis may be located along a common edge of the flow ducts. The common edge may be considered to be the point at which the two ducts join.

The flow network may further comprise an actuator configured to control movement of the flow directing member.

The linkage introduces direct correspondence between the movement of the flow reactive member and the movement of the flow directing member during powered actuation. This reduces the required number of actuators for moving the members.

The linkage may be configured, when the flow directing member is moved by said actuator, to transmit movement of the flow directing member to the flow reactive member.

The linkage may comprise a control crank connected to the flow directing member, a reactive crank connected to the flow reactive member, and a con rod extending between the control crank and the reactive crank.

The linkage may be configured to move the flow directing member and the flow reactive member to the same degree. For example, the flow directing member and the flow reactive member may both move in the same direction and/or by the same amount. For example, because of the presence of the linkage, pivoting of the flow reactive member about its axes in a first direction is transmitted via the linkage to the flow directing member. The movement is replicated in the flow directing member, which pivots in the same direction.

The linkage may alternatively be configured to move the first and flow reactive members in opposite senses.

The linkage allows the automatic adjustment of the flow through the flow ducts to be a passive operation, requiring no additional power to adjust the direction of the flow. The configuration of the con rod and the cranks result in a particularly efficient system, allowing movement of the flow directing member to be transmitted almost immediately to the other flow directing member, and further allows the reciprocal movement of the flow reactive member by the flow directing member.

The surface area of the flow reactive member presented to the flow downstream of the second axis may be greater than the surface area presented to the flow by either side of the first axis of the flow directing member.

This feature ensures that the net force generated by the flow reactive member by the fluid flow exiting the flow ducts, and which is transmitted to the flow directing member, is greater than, and therefore overrides, any net force generated by the flow directing member in the opposite direction, especially when an adjustment has been made to direct a higher proportion of fluid through one of the flow ducts. This means that the flow reactive member will remain in any adjusted position it adopts and will restrict movement of the flow directing member, retaining it in its adjusted position.

The flow directing member may present a substantially balanced surface area to the flow on the upstream and downstream side of the first axis and the flow reactive member presents an unbalanced surface area to the flow on each side of the second axis, having a larger area, preferably its entire surface area, downstream of the second axis.

This configuration of surface areas is particularly beneficial as it ensures that the forces applied to the flow directing member are also balanced about the first axis, so that there is no net force applied to the flow directing member by the gas flow. Providing an unbalanced surface area of the flow reactive member ensures that it moves about the second axis when an imbalance is present in the flow ducts.

The total surface area presented to the flow by the flow reactive member may be greater than the total surface area presented to the flow by the flow directing member.

The flow directing member and the flow reactive member both have neutral position in which the flow directing member and the flow reactive member are aligned with a flow direction through the inlet and/or the outlet. When the flow directing member and the flow reactive member are in the neutral position, an imbalance in flow exiting the first and second flow ducts results in a biasing of the flow reactive member. The biasing of the flow reactive member results in movement of the linkage which causes an associated biasing of the flow directing member, thereby correcting the imbalance.

Thus, any imbalances at the flow reactive member may result in movement of the flow reactive member to counteract the imbalance. The flow reactive member may therefore adopt a position within the network where the flows that are acting upon either side of it, i.e. from each flow duct, are equal. The movement of the flow reactive member in this respect, as described above, is transmitted through the linkage to the flow directing member. The flow directing member may therefore be moved by the linkage to adopt a position that balances the flow through each duct, thereby substantially eliminating any imbalance passively (i.e. without active control being applied).

According to another aspect of the invention, there is provided an energy recovery unit comprising a thermoelectric generator and a fluid flow network as described above wherein the thermoelectric generator module is positioned between the first and second flow ducts such that in use, the flow of gasses through the energy recovery unit can pass from the first flow duct to the second flow duct through the thermoelectric generator module.

According to another aspect of the invention, there is provided a vehicle exhaust system comprising the fluid flow network or the energy recovery as described above.

According to another aspect of the invention, there is provided a vehicle comprising the fluid flow network, the energy recovery unit, or the vehicle exhaust system as described above.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the invention will now be described, by way of example only, with reference to the accompanying drawings, in which.

DETAILED DESCRIPTION

As used herein, the term 'imbalance' when used in relation to fluid flow refers to any deviation from a predetermined distribution of flow along more than one flow path in a fluid flow network. For example, by this definition, an imbalance exists where a fluid flow network has been designed to incorporate two flow paths between which flow is intended to be distributed equally, but where in practice the proportion of fluid flow along the two flow paths is such that 51% of the fluid flows along one path, and 49% along the other. Similarly, an imbalance may exist where the network is designed so that fluid flow is split in a ratio of 70:30 between two fluid flow paths, while the actual split differs from this ratio. It will be accepted that these values are given as examples only, and that any intended proportion of flows may exist, and that an imbalance is considered to be any proportion of flows that is not the intended proportion.

Figure 1:
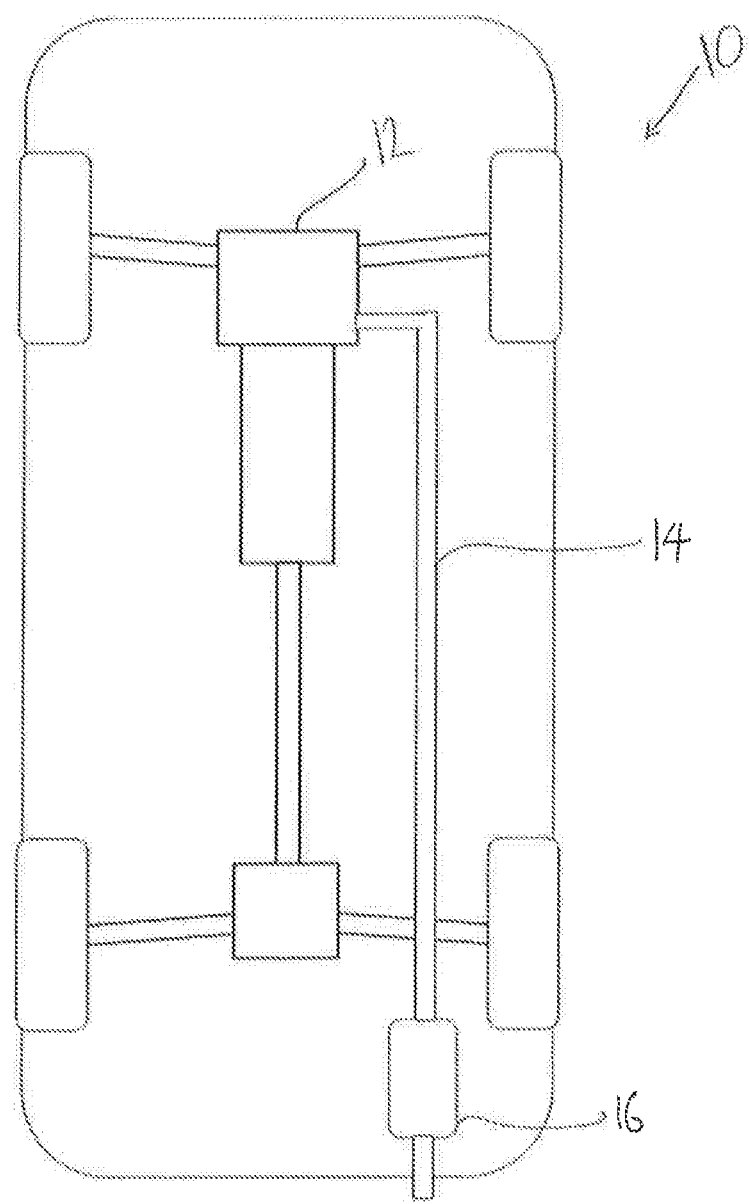
FIG. 1 is a schematic block diagram of a vehicle incorporating an energy recovery unit according to an embodiment of the present invention.

FIG. 1 is a schematic block diagram of a vehicle 10 which comprises an engine 12 connected to a vehicle exhaust system 14. An energy recovery unit 16 is incorporated in the vehicle exhaust system 14 and comprises a fluid flow network (not shown in FIG. 1) in accordance with embodiments of the present invention. Hot exhaust gas from the vehicle exhaust system 14 passes through the energy recovery unit 16 via the flow network before it is expelled from the vehicle 10. The energy recovery unit 16 harnesses the heat energy from the exhaust gas passing through it, converting the heat energy into electrical energy using thermoelectric generators (not shown in FIG. 1). The fluid flow network of the invention beneficially balances the fluid flowing through the ducts of the energy recovery unit 16, thereby reducing the likelihood of the thermoelectric generators overheating at one end.

Although the fluid flow network of the invention is described herein with relation to an energy recovery unit for use in a vehicle exhaust, it will be appreciated that the flow network may be used in any system requiring distribution of flow into two interconnected ducts or pipes diverging from a common inlet and converging at a common outlet. It will also be appreciated that the flow need not be equally split between the pipes or ducts but instead may be split into a certain ratio depending upon the required use of the flow network, as discussed above.

Figure 2:
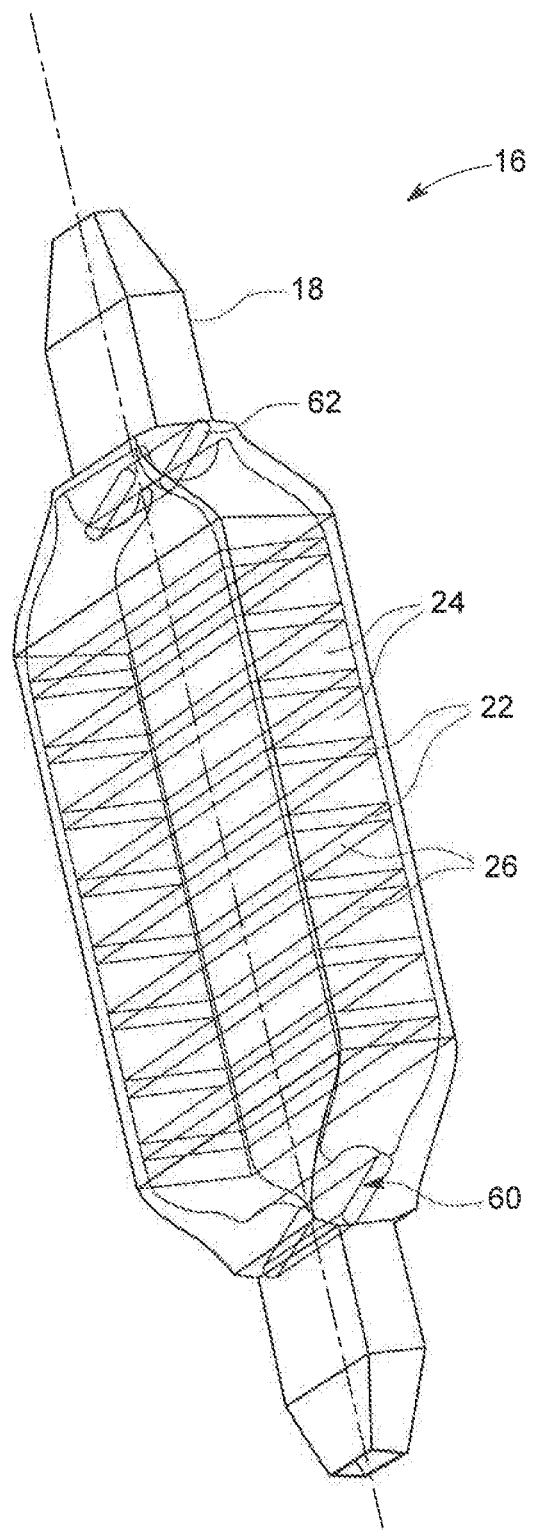
FIG. 2 is a perspective view of an energy recovery unit, which may be implemented in a vehicle exhaust system, such as that shown in FIG. 1.

FIG. 2 shows a perspective view of an energy recovery unit 16 in which a flow network 18 of the embodiment may be incorporated. FIGS. 3 to 6 illustrate schematic side views of an energy recovery unit 16 incorporating a flow network 18 as viewed from the side and in various configurations.

Figure 3:
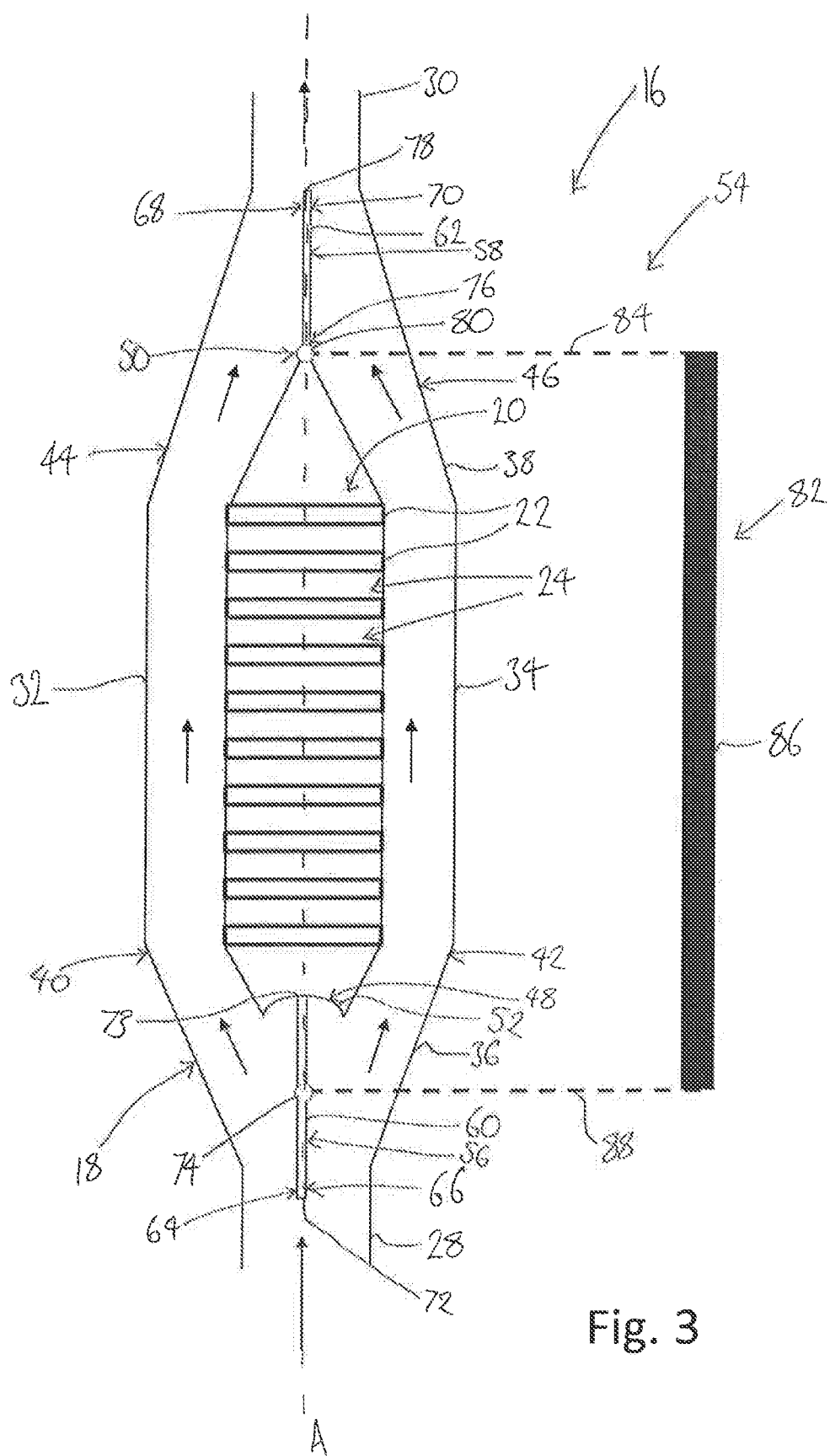
FIG. 3 is a schematic side view of an energy recovery unit according to an embodiment the invention as shown in FIG. 2.

Focusing initially on FIGS. 2 and 3, it can be seen that the energy recovery unit 16 comprises a thermoelectric generator (TEG) module 20 configured to recover heat energy from hot exhaust gas, and a fluid flow network 18 surrounding the TEG module 20. The TEG module 20 typically comprises a plurality of TEG units 22, a cooling system (not shown), and a frame (not shown) to hold the TEG module 20 together.

The TEG units 22 are arranged in parallel and spaced apart from one another so as to define a plurality of heat-exchange passages 24 therebetween that allow flow of exhaust gas through them from the fluid flow network 18. When exhaust gas flows through the passages 24, heat exchanging surfaces 26 of the TEG units 22 are exposed to the exhaust gas flowing through the passages 24, and thermoelectric materials disposed between the heat exchanging surfaces 26 are configured to convert heat energy from the exhaust gas to electrical energy for use in systems of the vehicle 10.

The thermoelectric materials are cooled by a cooling system, which both protects the TEG units 22 from overheating and produces a temperature gradient that is necessary across each TEG unit 22 to allow it to produce energy.

The fluid flow network 18 is disposed around the TEG module 20, and comprises an inlet pipe 28 and an outlet pipe 30 disposed at respective opposed ends of the energy recovery unit 16. Two separate bypass flow ducts 32, 34 are disposed on opposing sides of the TEG module 20 and connect the inlet and outlet pipes 28, 30. Both bypass flow ducts 32, 34 have the same shape and volume. The exhaust gas passages 24 of the TEG module 20 extend between the two bypass ducts 32, 34, perpendicular to the main axis A of the energy recovery unit 16.

Immediately beyond each end of the TEG module 20 the bypass ducts 32, 34 turn inwardly toward one another to converge, before merging with the inlet pipe 28 or the outlet pipe 30. The converging portions define, respectively, an inlet transition duct 36 leading from the inlet pipe 28 to the bypass ducts 32, 34, and an outlet transition duct 38 leading from the bypass ducts 32, 34 to the outlet pipe 30. The inlet and outlet transition ducts 36, 38 therefore each have a pair of branches 40, 42, 44, 46, an upper branch 40, 44 and a lower branch 42, 46 as viewed in FIG. 3, that diverge from a respective branch junction 50, each branch 40, 42, 44, 46 connecting a respective bypass duct 32, 34 with the junction 48, 50. In consequence, the inlet and outlet transition ducts 36, 38 are generally V-shaped as viewed from the side, as in FIG. 3. The inlet transition duct 36 incorporates a concave recess 52 at its branch junction 48 between the bypass ducts 32, 34, and this feature will be discussed later.

The energy recovery system 16 also comprises a flow directing system 54 disposed within the flow network 18 that is operable to control exhaust gas flow through the system. The flow directing system 54 includes a first (inlet) flow directing member 56 positioned in the inlet transition duct 36 between the inlet pipe 28 and the bypass flow ducts 32, 34. The flow directing system 54 also includes a flow reactive member 58, shown in the figures as a second (outlet) flow directing member positioned in the outlet transition duct 38 between the bypass flow ducts 32, 34 and the outlet pipe 30. The flow directing members 56, 58, which may be referred to as valves, are disposed within their respective transition ducts 36, 38 directly opposite and in the vicinity of their respective inlet or outlet pipe 28, 30. As will be explained, the flow reactive member 58 is configured to identify an imbalance in the flow across it.

The inlet flow directing member 56 and the outlet flow directing/reactive member 58 each comprise a planar element 60, 62, which can be moved about a respective valve axis to alter the orientation of the planar elements 60, 62, thereby controlling the direction of exhaust gas flow through the flow network 18, and more generally through the energy recovery unit 16, typically by guiding exhaust flow into and out of one of the bypass ducts 32, 34. The inlet and outlet planar elements 60, 62 are generally sheet-like in form, each having planar, upper and lower flow-directing surfaces 64, 66, 68, 70 for directing fluid flow into the upper and lower bypass ducts 32, 34 respectively. In the embodiment of FIGS. 2 to 6, the flow-directing surfaces 64, 66, 68, 70 of the inlet and outlet planar element 60, 62 are substantially rectangular.

In its orientation when in use, the inlet planar element 60 comprises a leading end 72, which faces exhaust gas flow, and a trailing end 73. The inlet planar element 60 is rotatably or pivotally mounted to an inlet shaft 74 extending between opposed internal walls (not shown) of the inlet transition duct 36. The inlet shaft 74 lies along an inlet valve axis and extends along the inlet planar element 60 at a location at or near to a midpoint between the leading and trailing ends 72, 73. The inlet valve axis is perpendicular to the main gas flow direction through the bypass ducts 32, 34 and longitudinally offset from either end of the planar element 60. In other words, the inlet shaft 74 is positioned between the ends of the inlet planar element 60 such that the inlet planar element 60 may be considered to be bisected by the inlet valve axis and shaft 74. Therefore, to each side of the shaft 74 and axis, the surface area of the planar element 60 that is exposed to the gas flow is equal and balanced.

The configuration of the inlet planar element 60 on its shaft 74 means that, when the planar element 60 moves from its neutral position, the leading end 72 of the planar element 60 moves in a first rotational sense, while the trailing end 73 of the planar element 60 moves in the opposite rotational sense.

Allowing the inlet planar element 60 to pivot near to its mid-point ensures that when the planar element 60 moves away from its neutral position and exposes one of its flow-directing surfaces 64, 66, i.e. the upper flow-directing surface or the lower flow-directing surface, to exhaust gas flow from the inlet pipe 28, the flow exerts similar forces to each side of the shaft 74 on that surface. This produces opposed rotational moments to each side of the shaft 74 which balance each other.

To facilitate the movement of the planar element 60, an internal junction wall extending between the upper and lower branches 40, 42 of the inlet transition duct 36 at the point where they converge incorporates a concave recess 52. The profile of the recess 52 generally corresponds to a path of the trailing edge 73 of the inlet planar element 60, which minimises the gap between the inlet planar element 60 and the internal wall for all inlet planar element positions, thereby avoiding the creation of leak paths between the inlet planar element 60 and the recess 52.

In use, the outlet planar element planar element in the form of an outlet valve flap 62 also comprises a leading end 76, which faces exhaust gas flow from the bypass ducts 32, 34, and a trailing end 78. The outlet valve flap 62 is rotatably or pivotally mounted to an outlet shaft 80 extending between opposed internal walls (not shown) of the outlet transition duct 38. The outlet shaft 80 lies along an outlet valve axis and extends along the leading edge of the outlet valve flap 62. The outlet valve axis is perpendicular to the main gas flow direction through the bypass ducts 32, 34.

The outlet valve flap 62 differs from the inlet planar element 60 in that it is pivotally mounted about its leading end 76 rather than at a mid-point between the two ends. Allowing the outlet valve flap 62 to pivot at its end ensures that the outlet valve flap 62 moves away from its neutral position if a force is exerted on either of its flow-directing surfaces 68, 70.

The flow directing system 54, and therefore the flow network 18, also comprises a linkage 82 that links the two planar elements. The linkage 82, which can be seen in FIGS. 3 to 6, comprises a reactive crank 84, a con rod 86, and a control crank 88 which are connected together and which together communicate movement of one planar element to the other planar element. Rotation of the outlet valve flap 62, for example, simultaneously rotates the reactive crank 84 which is attached to the outlet shaft 80. The movement of the reactive crank 84 pushes the con rod 82, and transmits the rotational movement to the control crank 88. The control crank 88 is connected to the inlet shaft 74, and rotation of the control crank 88 leads to a rotation of the inlet shaft 74. Consequently the inlet planar element 60 is rotated about the inlet shaft 74 and the inlet valve axis. In this way, the movement of the outlet valve flap 62 is transmitted to the inlet planar element 60.

The same process may be carried out in reverse, such that movement of the inlet planar element 60 results in a similar movement of the outlet valve flap 62, by transmitting rotation through the control crank 88 to move the con rod 86, which in turn rotates the reactive crank 84 and finally the outlet shaft 80 and outlet valve flap 62.

The linkage 82, together with the two planar elements 60, 62, may be considered to be a mechanism or means for balancing the flow through the energy recovery unit's fluid flow network 18.

In use, the position of the planar elements 60, 62 can be altered to change the amount of exhaust gas flowing through the bypass ducts 32, 34. In the energy recovery unit 16 shown in FIG. 3 the bypass ducts 32, 34 are identical and the exhaust gas flowing into the inlet pipe 28 is split equally between the bypass ducts 32, 34 with substantially 50% of the flow flowing through the upper bypass duct 32, and substantially 50% of the flow flowing through the lower bypass duct 34. In this case, the flow through each bypass duct 32, 34 is equal, with each planar element 60, 62 being positioned in a central, neutral position such that it is aligned with the direction of flow through the bypass ducts 32, 34. In an energy recovery unit 16 of this type, a balanced flow aids with reducing the likelihood of ends of the TEG units 22 overheating.

Figure 4:
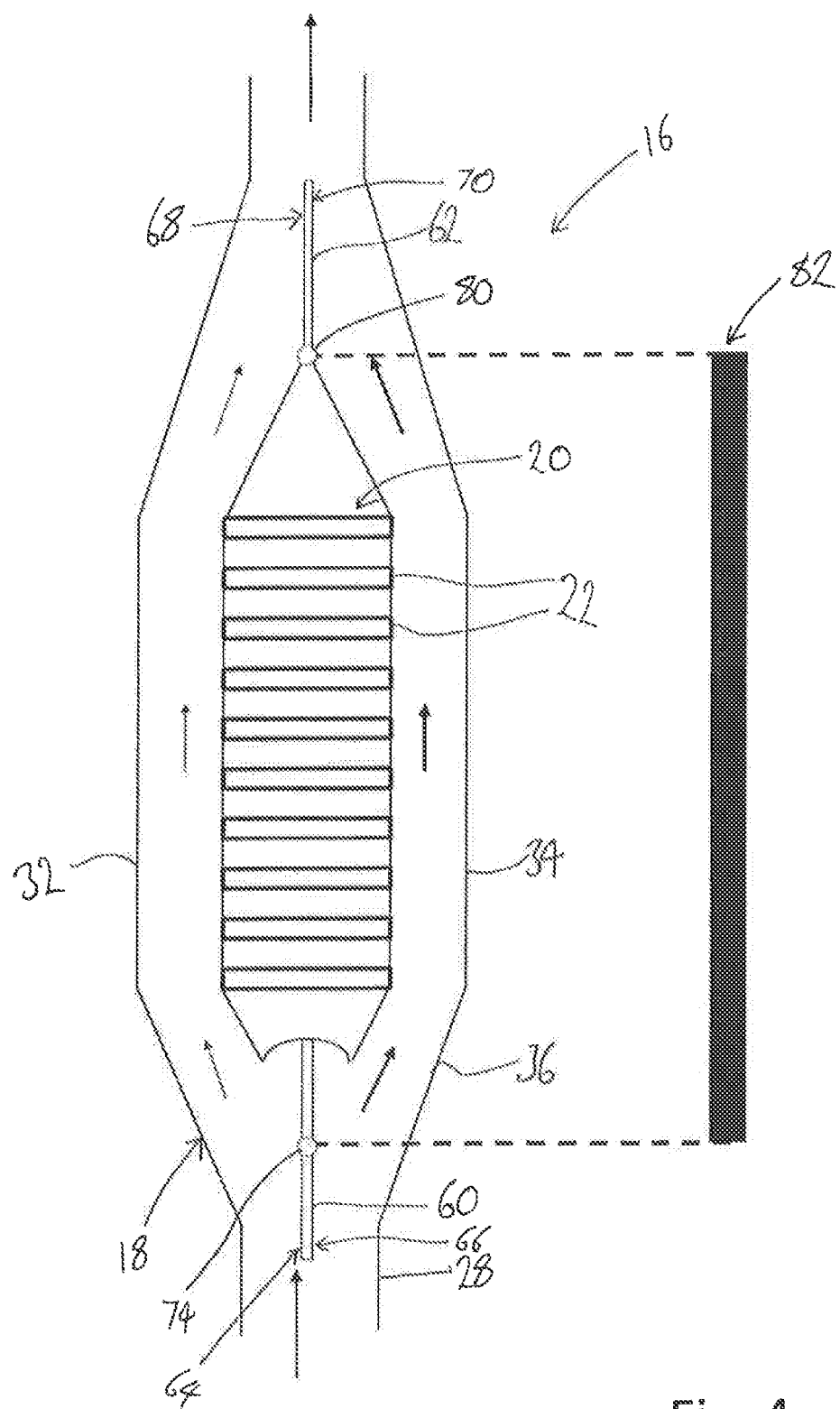
FIG. 4 is a schematic side view of the energy recovery unit of FIG. 3 incorporating an imbalance in the flow ducts.

FIG. 4 shows a similar energy recovery unit 16 to that of FIG. 3. However, in the energy recovery unit 16 of FIG. 4, the flow is imbalanced such that a greater proportion of the exhaust gas entering the inlet pipe 28 is directed into the lower bypass duct 34 than into the upper bypass duct 32 when the planar elements 60, 62 are positioned in their neutral positions. This imbalance may be due to an obstruction or malfunction present within the inlet pipe 28 or at the branch junction 36. Unbalanced flow may lead to damage being caused to the TEG module 20 due to overheating of the ends of the TEG unit 22 exposed to the unbalanced flow.

The flow directing system 18 of the invention is configured to detect the imbalance and to correct it using the flow reactive member and means for correcting the imbalance. In the energy recovery unit 16 of FIG. 4, the imbalance in flow means that the amount of exhaust gas flow incident on the lower flow directing surface 70 of the sensing, outlet valve flap 62 is greater than the amount of exhaust gas flow incident on the upper flow directing surface 68 of the outlet valve flap 62. Therefore, the force exerted on the flow directing surfaces 68, 70 is imbalanced and this results in a rotational torque being applied to the outlet valve flap 62 and shaft 80 about the outlet valve flap axis.

Figure 5:
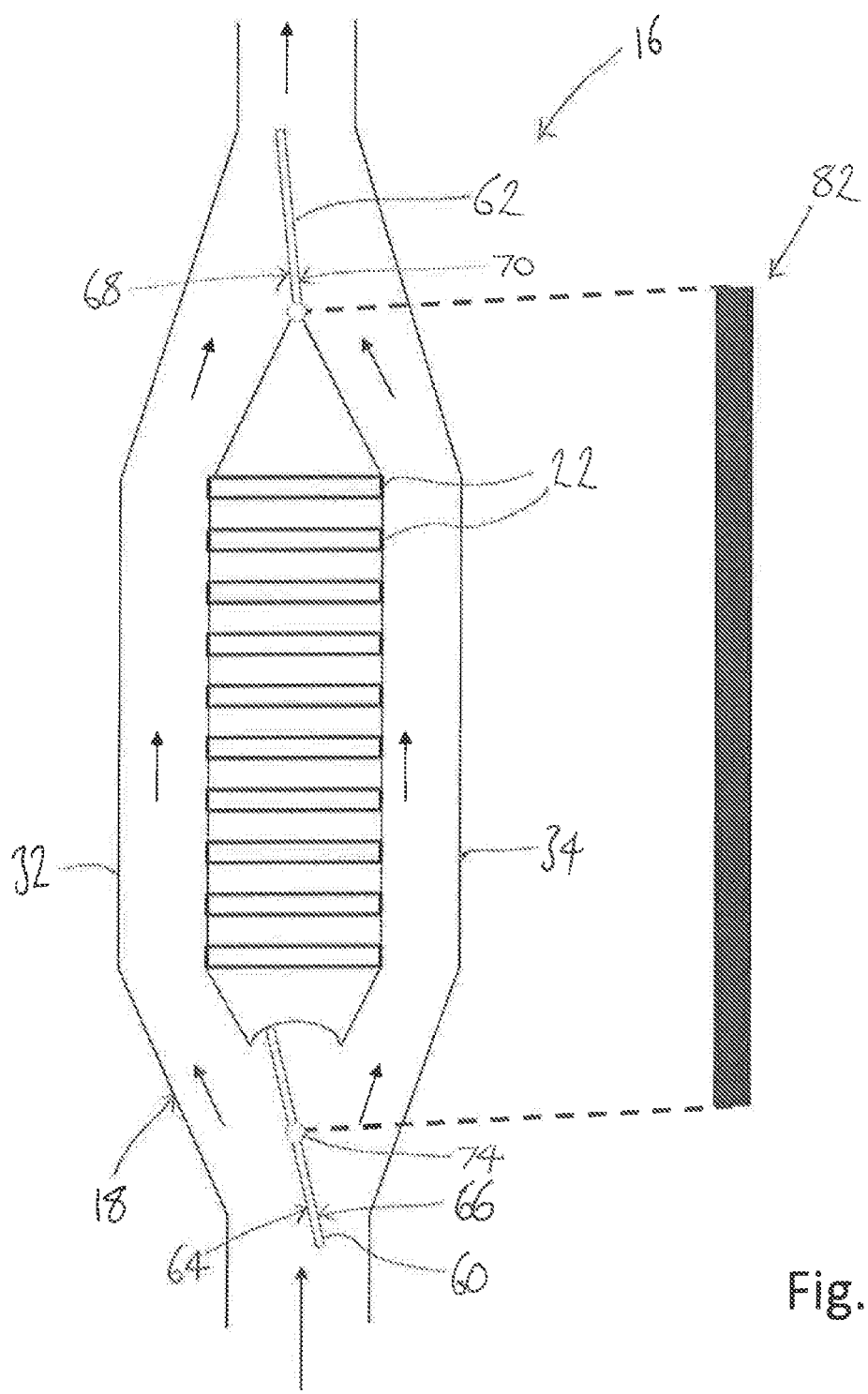
FIG. 5 is a schematic side view of the energy recovery unit of FIG. 4 in which the flow network is operating to correct an imbalance.

Therefore, the outlet valve flap 62 moves so that the amount of exhaust gas flow incident on each of its flow-directing surfaces 68, 70 is balanced, as shown in FIG. 5, and so that there is no net rotational torque or force on the outlet valve flap 62 due to the action of the exhaust gas flow.

Due to the linking of the outlet and inlet planar elements 60, 62 by the linkage 82, the movement of the outlet valve flap 62 due to the imbalanced flow simultaneously results in a similar movement of the inlet planar element 60 in a similar sense and with a similar magnitude. The movement of the inlet planar element 60 and shaft 74 about the inlet valve axis results in a balancing of the flow directed through each of the bypass ducts 32, 34, and therefore a reduction in the potential for overheating of the TEG units 22.

The location of each axis relative to the respective planar elements 60, 62 aids in the continued balancing of flow. As noted above, movement of the inlet planar element 60 about its inlet valve axis exposes one flow-directing surface to the flow, and as a result of the flow directing surfaces 64, 66 of the inlet planar element 60 having a balanced surface area to each side of the inlet shaft 74, the forces applied by the exhaust gas flow incident on the exposed flow-directing surface 64, 60 are also balanced. Therefore, there is no net force on the inlet planar element 60, whereas an unbalanced flow results in a net force on the outlet valve flap 62 about the outlet valve axis. Therefore, corrective movement of the outlet valve flap 62 from a neutral position to a corrected position due to an imbalance of flow through the bypass ducts 32, 34 results in a movement of the inlet planar element 60 to a similar degree or sense, which is then maintained due to the forces on each planar element 60, 62 then being balanced and there being no net force on either planar element 60, 62.

Even if the inlet planar element 60 is not balanced and a net force is applied to its gas directing surfaces 64, 66, it will be appreciated that the force on the flow-directing surfaces 68, 70 of the outlet valve flap 62 will be greater than the force experienced by the inlet planar element 60 due to the outlet valve flap 62 having a greater exposed surface area on which the force acts than that of the inlet planar element 60.

The energy recovery unit 16 may further comprise an actuator (not shown) configured to control movement of the inlet planar element 60 about its inlet valve axis. The actuator controls the degree and direction of deflection of the inlet planar element 60, thereby controlling the direction of exhaust gas flow through the energy recovery unit 16.

Figure 6:
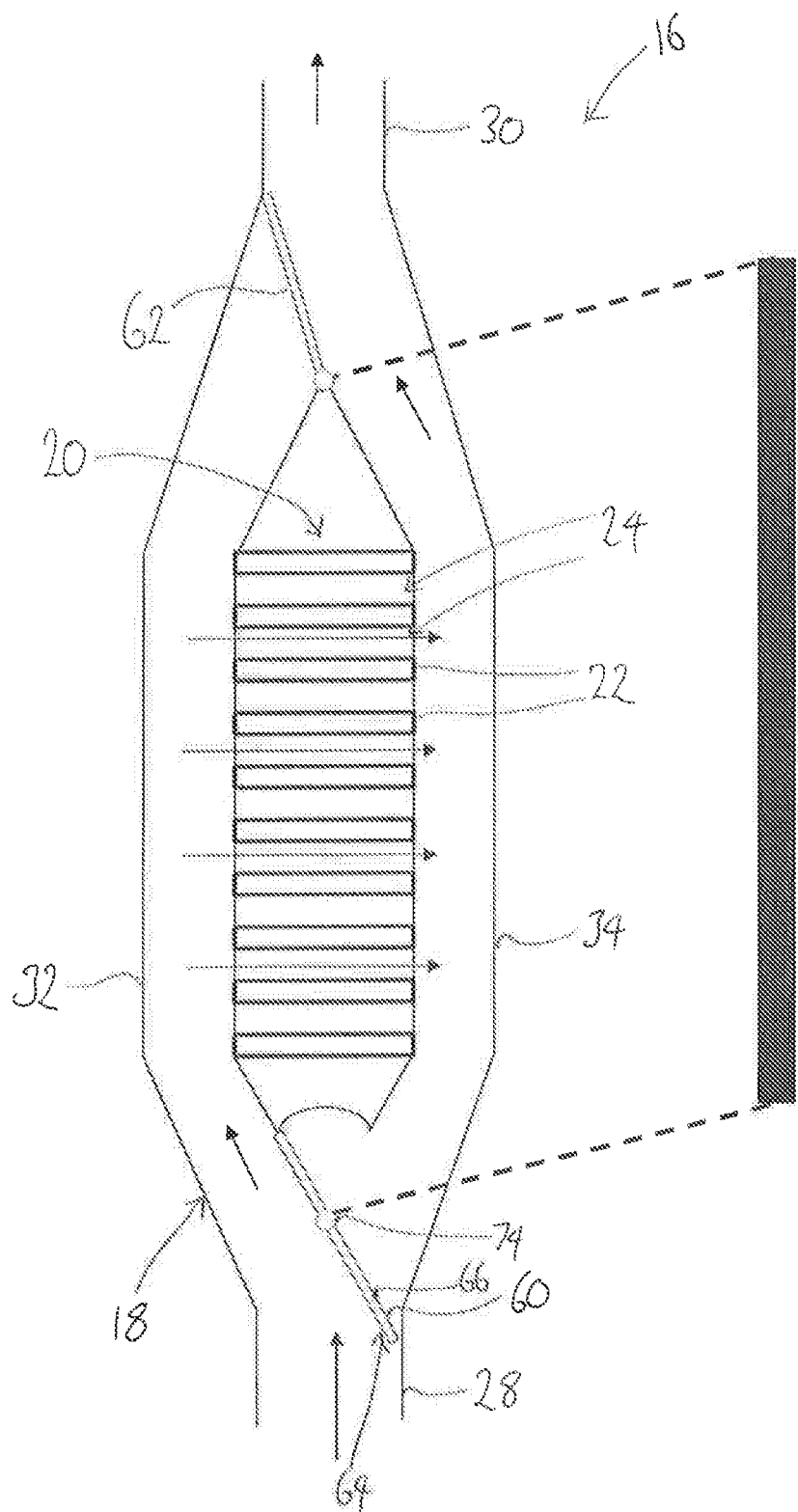
FIG. 6 is a schematic side view of the energy recovery unit of FIG. 4 in a full flow mode.

The actuator may be used to control the flow through the passages 24 between TEG units 22, as illustrated in FIG. 6, which illustrates a 'full flow' mode. In this mode, the inlet planar element 60 is maximally deflected by the actuator so as to direct all exhaust gas flow through the inlet pipe 28 into one of the bypass ducts 32, 34. In the example of FIG. 6, the lower bypass duct 34 is occluded, and all exhaust gas flow is being directed into the upper bypass duct 32. Movement of the inlet planar element 60 by the actuator is translated to the outlet valve flap 62, which occludes the opposite bypass duct 32 (i.e. the upper bypass duct), allowing flow to exit the bypass duct 32 only via the lower bypass duct 34. Thus, as no direct route through either bypass duct 32, 34 from inlet to outlet 28, 30 is available for the gas to flow, the exhaust gas is forced through the passages 24 between the TEG units 22 of the TEG module 20. The TEG module 20 can therefore perform its function of re-using heat energy from the exhaust gas to generate electricity for use in the vehicle 10.

It should also be noted that the turning force required from the valve actuator is minimised due to the balancing of the forces and surface area to either side of the inlet shaft 74. The skilled reader will appreciate that this balancing effect is optimised when the shaft 74 is positioned such that there is an equal area of flow-directing surface 64, 66 to each side of the shaft 74.

Although a specific deflection of the planar elements 60, 62 is shown in FIG. 6, it should be noted that the functionality of the energy recovery unit 16 would not be substantially affected if the deflections of the planar elements 60, 62 were to be reversed from that which is illustrated.

Figure 7:
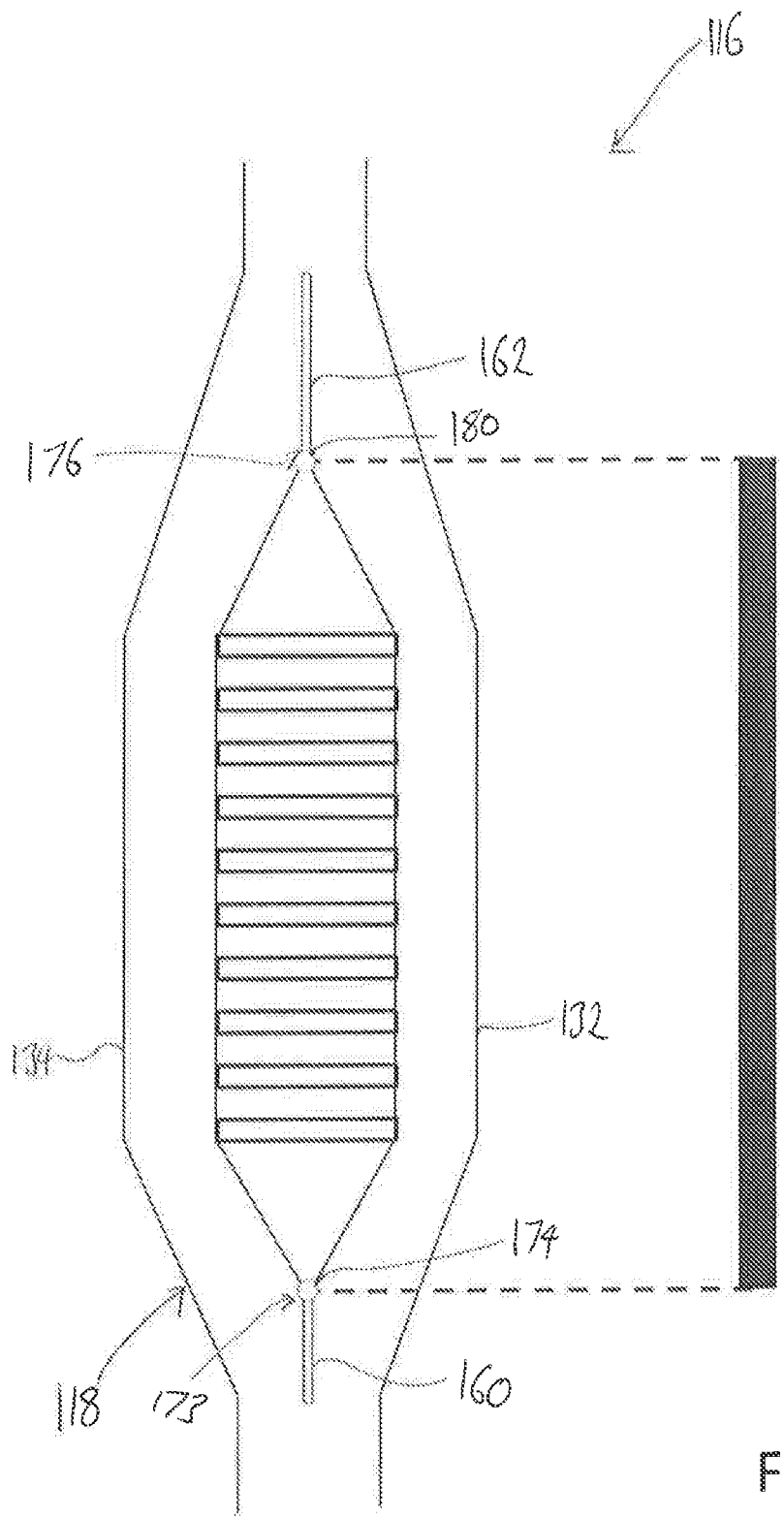
FIG. 7 is a schematic side view of an energy recovery unit according to an embodiment the invention.

An alternative embodiment of an energy recovery unit 116 incorporating a fluid flow network 118 is shown in FIG. 7. In this embodiment, both inlet and outlet planar elements are valve flaps 160, 162 are rotatably or pivotally mounted to a respective shaft 174, 180 extending along an edge 173, 176 of the valve flap 160, 162.

In this embodiment, however, it should be noted that the outlet valve flap 162, or flow reactive member, has a larger surface area exposed to the flow than the surface area exposed to the flow by the inlet valve flap 160.

The balancing of the flow through the bypass ducts 132, 134 retains the outlet valve flap 162 in its corrected (intended) position, which in turns holds the inlet valve flap 160 in its corrected position. The flow incident on the inlet valve flap 160 is subsequently unbalanced. However, as the outlet valve flap 162 has a greater surface area exposed to the exhaust gas flow than the inlet valve flap 160, the rotational torque or force applied to the outlet valve flap 162 is greater than that applied to the inlet valve flap 160. Therefore, any rotational force applied to the inlet valve flap 160 is essentially overridden by the outlet valve flap 162 due to the increased surface area and therefore the increased forces that are applied to the outlet valve flap 162 by the exhaust gas flow.

This is particularly useful to allow existing fluid flow networks to be adapted to incorporate flow balancing, especially if it is not possible to incorporate a concave recess to allow the balanced inlet valve flap to be incorporated.

Figure 8:
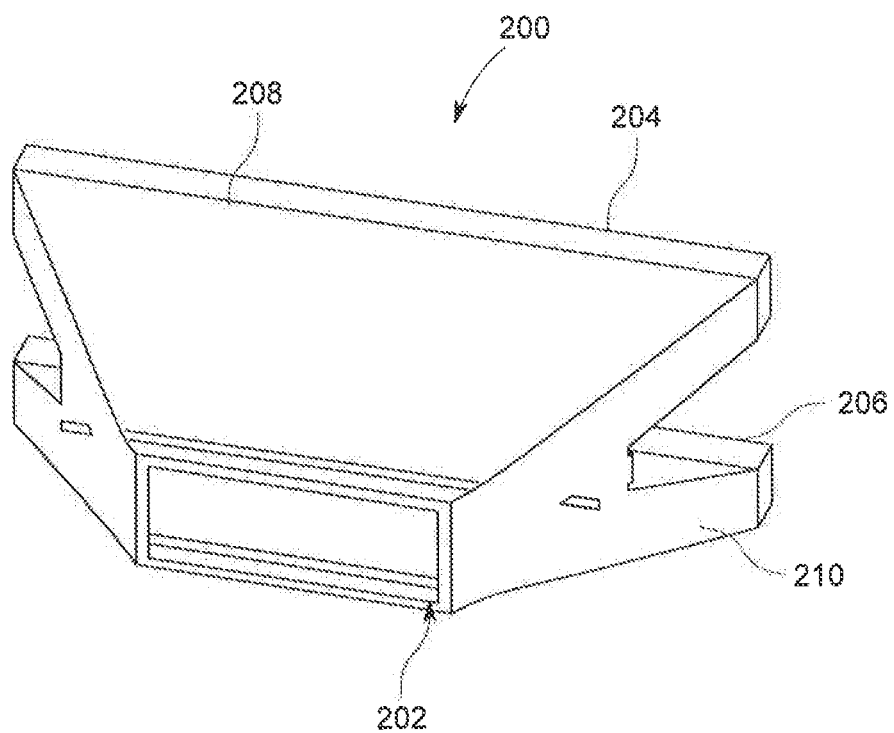
FIG. 8 is a perspective view of an inlet duct of a type that may be incorporated into the energy recovery unit of FIG. 2.

In some embodiments, the shape of the planar element, and therefore of the transition ducts, may differ. For example, in one embodiment, the inlet and outlet transition ducts also taper longitudinally as viewed from above, to define a trapezoidal cross-section. An example of a transition duct 200 having a trapezoidal cross-section of this kind is shown in FIG. 8. The transition duct 200 of FIG. 8 connects to an inlet or outlet pipe at its opening 202, and to the bypass ducts at openings 204, 206 at the end of its branch junctions 208, 210. As a result of tapering of the transition ducts along two orthogonal axes, the inlet and outlet transition ducts are generally in the form of truncated, rectangular-based pyramids that narrow outwardly from the bypass ducts.

This structure means that the inlet and outlet ducts have a transverse cross-sectional area that increases with longitudinal displacement between the inlet or outlet pipe towards the bypass ducts. This increasing area allows gas flowing through the inlet and outlet transition ducts to expand gradually, which ensures that the exhaust gas spreads evenly into and throughout the bypass duct. This in turn ensures that the gas flow covers the entire TEG module for optimised energy recovery.

In this embodiment, the inlet and outlet planar elements (not shown) are configured to correspond to the internal profile of their respective transition ducts. The inlet and outlet planar elements are therefore generally sheet-like in form, having planar, trapezoidal upper and lower gas-directing surfaces, each having a pair of parallel sides joined by a pair of inclined sides set at an angle corresponding to the internal profile of the respective transition duct within which they are mounted.

In practice, a trapezoidal inlet planar element would comprise a leading end, which is the shorter of the parallel sides of the trapezium and which faces exhaust gas flow, and a trailing end which is the longer of the parallel sides. The inlet planar element is rotatably or pivotally mounted to a shaft extending between opposed internal walls of the inlet transition duct. The shaft may extend either along the trailing end of the planar element, or along a valve axis positioned so as to result in a balanced surface area to either side of the shaft. For a trapezoid planar element, this implies positioning the shaft slightly closer to the longer of the parallel edges, corresponding to the trailing end of the inlet planar element.

It will be appreciated that, in the present invention, an outlet shaft would extend only along one end of an outlet valve flap. In the case of a trapezoidal outlet valve flap, it is envisaged that the shaft would extend along the longer of the trailing edge and the leading edges of the flap.

Figure 9:
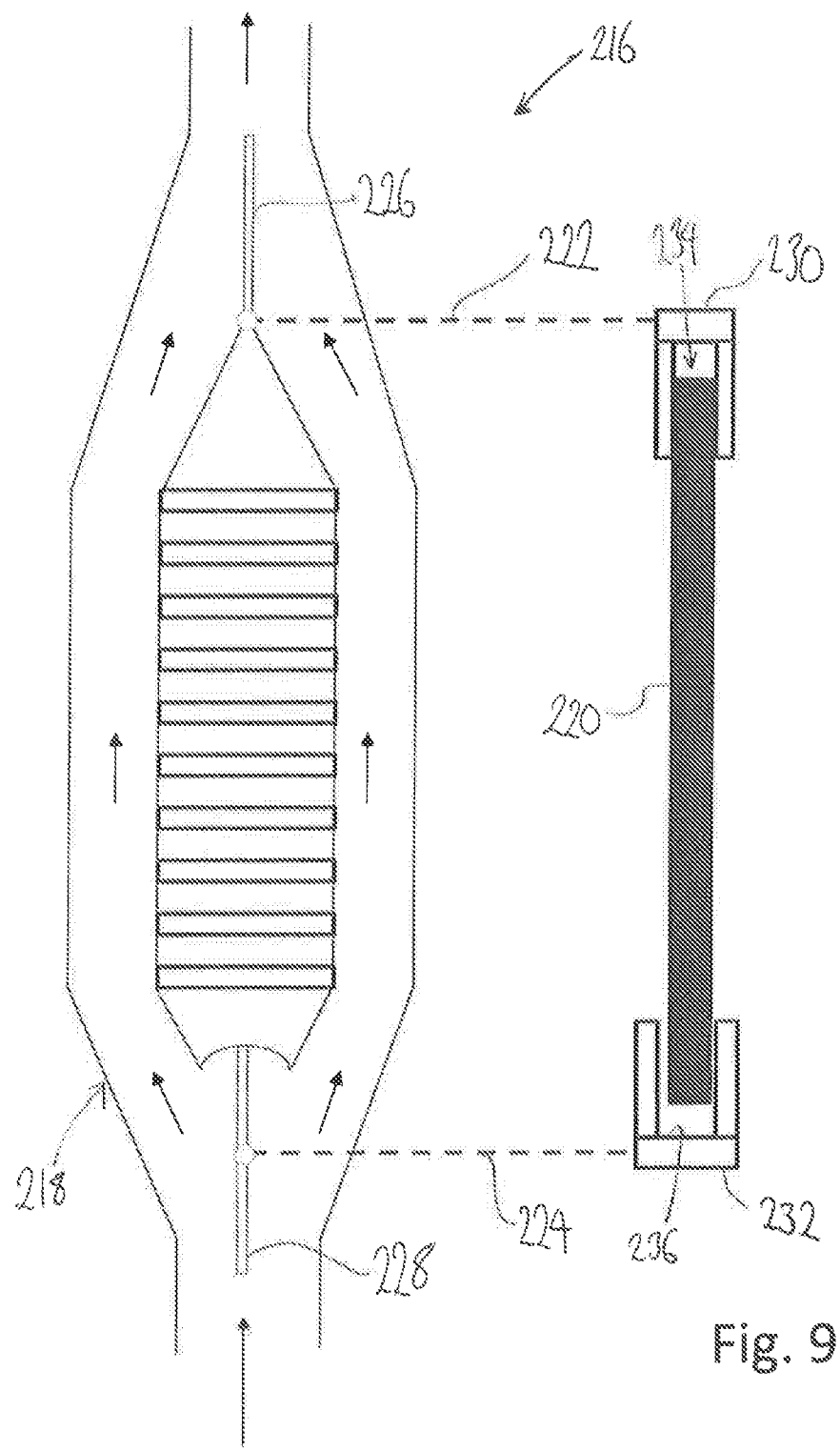
FIG. 9 is a schematic side view of an energy recovery unit according to another embodiment.

An alternative embodiment of an energy recovery unit 216 incorporating a fluid flow network 218 is shown in FIG. 9. In some fluid flow networks, it is desirable for the flow directing members to move in opposite senses. FIG. 9 illustrates one way in which this may be implemented, although it will be appreciated that alternative solutions may be implemented without departing from the scope of the claims.

In FIG. 9, the con rod 220 is movable with respect to the reactive and control cranks 222, 224, such that movement of one of the flow directing members 226, 228 in a first direction rotates the con rod 220 within its holders 230, 232. The rotation of the con rod 220 by one of the flow directing members 226, 228 moving in a first direction is communicated to the other flow directing member 228, 226 to effect a movement in the opposite sense or direction, by virtue of threaded ends 234, 236 of the con rod 220 or other appropriate means that facilitates movement of the cranks 222, 224 towards one another.

While the above embodiments of the fluid flow network are discussed in relation to thermoelectric generators only, it will be appreciated that the fluid flow network may be utilised as part of a variety of other devices. For example, other heat exchangers, particularly those devices operating to utilise the Organic Rankine Cycle to recover heat, may incorporate the fluid flow network described herein. Alternatively, the fluid flow network may be used as part of energy recovery units that do not recover heat energy but that are still susceptible to overheating due to the fluids being exposed to high temperatures.

Many modifications may be made to the above examples without departing from the scope of the present invention as defined in the accompanying claims.

The invention claimed is:

1. A fluid flow network for a vehicle, the fluid flow network comprising:
    first and second flow ducts having a common inlet and a common outlet;
    a flow directing member configured to direct flow from the common inlet to at least one of the first and second flow ducts;
    a flow reactive member configured to move in response to an imbalance between flow exiting the first flow duct and flow exiting the second flow duct; and
    a linkage configured to transmit movement of the flow reactive member to the flow directing member if an imbalance causes movement of the flow reactive member.

2. The fluid flow network of claim 1, wherein
    the flow directing member is movable about a first axis, and
    the flow reactive member is movable about a second axis.

3. The fluid flow network of claim 2, wherein
    the flow directing member is disposed in a first transition duct joining the common inlet and the first and second flow ducts, and
    the flow reactive member is disposed in a second transition duct joining the first and second flow ducts and the common outlet.

4. The fluid flow network of claim 3, wherein
    the flow directing member is defined by a planar element which includes an upstream edge and a downstream edge, and
    the first axis is located between the upstream edge and the downstream edge.

5. The fluid flow network of claim 4, wherein the first transition duct comprises a concave recess between the first and second flow ducts.

6. The fluid flow network of claim 4, wherein the second axis is located along a common edge of the flow ducts.

7. The fluid flow network of claim 3, wherein
    the flow reactive member is defined by a planar element which includes an upstream edge and a downstream edge, and
    the second axis is located substantially along the upstream edge.

8. The fluid flow network of claim 7, wherein a surface area presented by the flow reactive member downstream of the second axis is greater than a surface area presented by either side of the first axis of the flow directing member.

9. The fluid flow network of claim 2, wherein the flow directing member presents a substantially balanced surface area to flow on an upstream side and a downstream side of the first axis.

10. The fluid flow network of claim 1, wherein the linkage is configured to move the flow directing member and the flow reactive member to the same degree.

11. The fluid flow network of claim 1, wherein the linkage is also configured to transmit movement of the flow directing member to the flow reactive member.

12. The fluid flow network of claim 1, wherein the linkage comprises
    a control crank connected to the flow directing member,
    a reactive crank connected to the flow reactive member, and
    a con rod extending between the control crank and the reactive crank.

13. The fluid flow network of claim 1 wherein
    the flow directing member and the flow reactive member are positionable in a neutral position in which the flow directing member and the flow reactive member are aligned with a flow direction through at least one of the inlet and the outlet, and
    when the flow directing member and the flow reactive member are in the neutral position, an imbalance in flow exiting the first and second flow ducts results in a biasing of the flow reactive member, and consequently, movement of the linkage and biasing of the flow directing member to correct the imbalance.

14. An energy recovery unit comprising a thermoelectric generator module and the fluid flow network of claim 1, wherein the thermoelectric generator module is positioned between the first and second flow ducts and configured to allow at least some flow of gas through the energy recovery unit to pass from the first flow duct to the second flow duct through the thermoelectric generator module.

15. A vehicle comprising the energy recovery unit of claim 14.

16. A vehicle exhaust system comprising the energy recovery unit of claim 14.

17. A vehicle comprising the vehicle exhaust system of claim 16.

18. A vehicle exhaust system comprising the fluid flow network of claim 1.

19. A vehicle comprising the vehicle exhaust system of claim 18.

20. A vehicle comprising the fluid flow network of claim 1.

* * * * *